(12) United States Patent
Katscher et al.

(10) Patent No.: US 7,123,007 B2
(45) Date of Patent: Oct. 17, 2006

(54) MR IMAGE RECONSTRUCTION

(75) Inventors: Ulrich Katscher, Norderstedt (DE); Johannes Jacobus Van Vaals, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 740 days.

(21) Appl. No.: 09/995,439

(22) Filed: Nov. 27, 2001

(65) Prior Publication Data
US 2002/0074999 A1 Jun. 20, 2002

(30) Foreign Application Priority Data
Nov. 30, 2000 (DE) .......................... 100 59 772

(51) Int. Cl.
*G01V 3/00* (2006.01)

(52) U.S. Cl. ..................... 324/309; 324/307
(58) Field of Classification Search ................ 324/309, 324/307, 318, 312; 600/410; 128/653.2
See application file for complete search history.

(56) References Cited

U.S. PATENT DOCUMENTS

| | | | | |
|---|---|---|---|---|
| 5,910,728 A | * | 6/1999 | Sodickson | 324/309 |
| 6,198,283 B1 | * | 3/2001 | Foo et al. | 324/309 |
| 6,317,619 B1 | * | 11/2001 | Boernert et al. | 6/410 |
| 6,326,786 B1 | * | 12/2001 | Pruessmann et al. | 324/312 |
| 6,377,045 B1 | * | 4/2002 | Brink et al. | 324/307 |
| 6,469,505 B1 | * | 10/2002 | Maier et al. | 324/309 |
| 6,528,998 B1 | * | 3/2003 | Zhou et al. | 324/309 |

OTHER PUBLICATIONS

"MR–Imaging," Research Disclosure 429053, Oct. 1, 2000.

* cited by examiner

*Primary Examiner*—Brij B. Shrivastav
(74) *Attorney, Agent, or Firm*—John Vodopia

(57) ABSTRACT

The invention relates to an MR imaging method in which the parallel acquisition of the MR data, for example in conformity with the SMASH or SENSE methods, is performed by means of a plurality of receiving coils. The different spatial sensitivity profiles of the receiving coils are used for the image reconstruction. When the sensitivity data used during the image reconstruction do not correspond to the position in space of the receiving coils during the image acquisition, undesirable image artifacts will occur. In accordance with the invention such artifacts are eliminated by (virtually) adapting the spatial sensitivity profiles automatically during the image reconstruction.

11 Claims, 2 Drawing Sheets

MR IMAGE RECONSTRUCTION

BACKGROUND

The invention relates to an MR imaging method in which a number of MR data sets is combined so as to form an image of the nuclear magnetization distribution in an examination zone while utilizing the fact that a spatial sensitivity profile of a receiving element used for the acquisition of the relevant MR data set is associated with each MR data set. The invention also relates to an MR apparatus for carrying out the method and to a computer program for controlling an MR apparatus of this kind.

In MR imaging is common practice to pick up the magnetic resonance signal as a voltage that is induced, under the influence of a suitable sequence of RF pulses and gradient pulses in the time domain, into a coil that encloses the examination zone. The actual image reconstruction is performed by Fourier transformation of the time signals. The number, the spacing, the duration and the strength of the gradient pulses used define the sampling of the reciprocal k space that defines the volume to be imaged (Field of View or FOV) as well as the image resolution. The requirements imposed in respect of the image format and the image resolution define the number of phase encoding steps and hence the duration of the imaging sequence. The foregoing leads directly to one of the essential drawbacks of magnetic resonance tomography, because the acquisition of an image of the complete examination zone with a resolution that suffices for diagnostic purposes usually requires an undesirably long period of time.

A large number of technical developments in the field of magnetic resonance tomography aim to achieve a drastic reduction of the image acquisition times. Hardware developments that enable an as fast as possible switching of the magnetic field gradients have now reached the limits of technical feasibility as well as the limits of what a patient can be expected to bear physiologically. For a number of applications that include notably interventional MR imaging, however, the acquisition times are still too long.

It seems that the existing technical and physiological speed limits of conventional Fourier imaging can be overcome by the recently emerging parallel MR methods such as, for example the SMASH (Simultaneous Acquisition of Spatial Harmonics) technique or the SENSE (Sensitivity Encoding) technique. These techniques are based on the insight that the spatial sensitivity profile of the receiving elements (resonators, coils, antennae) impress on the magnetic resonance signals positional information that can be used for the image reconstruction. When a plurality of separate receiving elements, each having a different spatial sensitivity profile, is used in parallel, the acquisition time required for an image can be reduced by combination of the respective detected magnetic resonance signals; in comparison with customary Fourier reconstruction a reduction is achieved by a factor which is generally equal to the number of receiving elements used (see Pruessmann et al., Magnetic Resonance in Medicine 42, pp. 952 to 962, 1999).

An MR imaging method of the kind set forth is described, for example in WO 99/54746. According to said known method first a plurality of MR data sets is acquired while utilizing a plurality of receiving coils. The sensitivity of each of the receiving coils is dependent on the distance between the nuclear magnetization and the relevant coil. The combining of the individual image data sets utilizes the spatial sensitivity profiles so as to reconstruct an image of the examination zone that is larger than the scanning zone predetermined by the pulse sequence used.

The use of the SENSE method is particularly advantageous when the MR signals are picked up by means of surface coils that are arranged directly on the patient. Coils of this kind have a severely inhomogeneous spatial sensitivity profile; this represents an advantage for the image reconstruction by means of SENSE. For MR angiography, for example, a flat RF coil can be arranged underneath the back of a patient and another flat RF coil can be positioned on the thorax. Because the spatial sensitivity profiles of the receiving coils must be accurately known in order to carry out the SENSE method, the imaging operation starts with a so-called reference measurement. During this reference measurement the full FOV is additionally scanned by means of a whole body coil that has a spatially constant sensitivity profile. The spatial sensitivity profiles of the surface coils used are then determined by comparison, that is, by relating the image data acquired by means of the surface coils to the data of the whole body coil. A comparatively low image resolution can be used for the determination of the spatial sensitivity profiles. Therefore, the reference measurement can be performed very quickly. During the subsequent image acquisition a reduced FOV is used, the complete image being reconstructed while utilizing the sensitivity profiles determined, that is, by combining the MR data simultaneously acquired by means of the two surface coils. In comparison with conventional Fourier imaging, the image acquisition times have thus been reduced by a factor of 2 for the same image format and the same image resolution.

However, the known SENSE imaging method has the drawback that in the course of time changes are liable to occur in the position in space of the receiving coils. It is notably when surface coils are arranged directly on the patient that displacements of the receiving coils are unavoidable because of motions of the patient. Such a displacement of the receiving elements changes the associated spatial sensitivity profiles to such an extent that the image reconstruction in conformity with the SENSE method is subject to errors.

SUMMARY

Considering the above-mentioned drawbacks, it is an object of the present invention to improve parallel MR methods, such as the SMASH and the SENSE imaging methods, such that they can be used notably for fast image acquisition with a high image quality, that is, even when the position in space of the receiving coils changes in the course of time, for example in cases where surface coils are arranged on the patient.

This object is achieved in accordance with the invention by means of an MR imaging method of the kind set forth which is characterized in that during the image reconstruction the spatial sensitivity profiles are adapted in conformity with the position in space of the receiving elements during the image acquisition.

The present invention is based on the recognition of the fact that the spatial sensitivity profiles that are required for the image reconstruction in conformity with the parallel SMASH or SENSE methods are fixed relative to the position in space of the receiving elements used. Using a reference measurement, the spatial sensitivity profiles of the individual receiving elements can be determined with an adequate degree of accuracy. Displacements in space and/or rotations of the receiving elements as they occur during the actual image acquisition, for example due to motions of the patient, can be simply compensated by subjecting the spatial sensitivity profiles as determined during the reference measurement to a corresponding geometrical transformation. It is advantageous that corrections of this kind can be readily carried out by means of the customary data processing systems used for the image reconstruction.

The invention thus enables fast SENSE imaging which requires only a single reference measurement, that is, even when the position in space of the receiving coils used changes in the course of time, for example, due to the patient motions.

In accordance with the dependent claim 2 the geometrical transformation of the spatial sensitivity profiles in the method in accordance with the invention is advantageously carried out by simulating displacements and/or rotations of the relevant receiving elements on the basis of their position during the reference measurement. When an MR angiography operation is performed as described above, during which a surface coil is arranged on the thorax of the patient, the relevant coil moves up and down in conformity with the respiratory motion of the patient. A geometrical transformation of the spatial sensitivity profile in accordance with the invention can in that case consist of a simple, one-dimensional spatial translation. However, other, more complex displacements are also feasible, for example displacements that involve all three spatial directions and for which additionally rotations have to be taken into account. Such displacements or rotations of the receiving elements may occur, for example, when the coils inadvertently get out of place during the image acquisition.

It is also possible for the spatial sensitivity profiles to be changed by deformations of the receiving elements. Moreover, for various reasons the field distribution in the examination zone could also change in the course of the execution of an examination. When deformation correction of the sensitivity profiles can be carried out in conformity with claim 3, a practically random geometrical transformation can be advantageously performed, so that no limits are imposed as regards the adaptation of the sensitivity profiles. Such deformation corrections can be performed, for example by applying the described displacements and/or rotations section-wise to the sensitivity profiles.

Algorithms that are suitable for imaging by means of the SMASH or SENSE techniques and can be readily implemented in reconstruction units of conventional MR apparatus are described in literature. Algorithms of this kind enable the image data acquired with a reduced FOV to be used so as to reconstruct a complete image of the examination zone while utilizing the exact knowledge of the spatial sensitivity profiles. Notably the inherently occurring aliasing effects in the image data acquired with a reduced FOV are thus canceled. Characteristic artifacts occur when the sensitivity profiles on which the reconstruction is based do not correspond to reality because, for example, the position in space of the receiving elements has changed during the image acquisition. Such characteristic artifacts are notably faults in the image intensity which may become manifest as inhomogeneous brightness variations throughout the image. In the worst case this may give rise to incorrect reconstruction; remainders of aliasing then persist, with the result that objects in the examination zone appear in the incorrect location in the image.

The version of the method in accordance with the invention that is disclosed in claim 4 enables advantageous evaluation of said image artifacts in order to carry out the adaptation of the spatial sensitivity profiles automatically during the image reconstruction. The execution of the image reconstruction is then repeated each time on the basis of the same MR data sets and while systematically varying the spatial sensitivity profiles. The sensitivity profiles of the receiving elements used, determined by means of a suitable reference measurement, are stored in the reconstruction unit of the MR apparatus used and can then be (virtually) adapted in such a manner that the artifacts appearing in the reconstructed image are minimized. Because the image artifacts that stem from displacements, rotations and/or distortions of the receiving elements are characteristic as described above, such artifacts can be simply detected and evaluated automatically by means of the reconstruction unit.

Granted, said image artifacts in principle occur throughout the image, but for the method in accordance with the invention as disclosed in claim 5 it suffices when the image reconstruction that is repeatedly executed for the automatic adaptation of the sensitivity profiles is limited to parts of the overall image. This is advantageously possible because said image artifacts occur in characteristic positions in the image that are known in advance and are dependent, for example on the specific choice of the reduced FOV.

It is particularly advantageous to minimize gradients in the image intensity during the automatic adaptation of the spatial sensitivity profiles in conformity with claim 6. Such distinct gradients occur in the image in locations where the outer limits of the full image format are folded in the reduced FOV by aliasing. It is notably when surface coils are used that there is an increased sensitivity at the edge of the image region. When the relevant receiving element has been displaced relative to the reference measurement, the described intensity gradients are pronounced. The intensity gradients preferably occur in a location that is dictated by the phase encoding used during the image acquisition, so that the reconstruction by means of the SENSE technique can be limited to the relevant location for the automatic adaptation of the spatial sensitivity profiles in accordance with the invention; this results in a significant saving of time.

Preferably, neighboring image lines are compared with one another in conformity with claim 7. In order to minimize the image artifacts, in accordance with the invention it is then necessary to reconstruct only the relevant image lines and to calculate the ratio of their intensities. Directly neighboring image lines represent approximately the same anatomical structure but, because of the incorrect adaptation of the spatial sensitivity profiles, they may possibly have a different brightness. The sensitivity data is varied in accordance with the invention by (virtual) geometrical transformation until the two neighboring image lines deviate as little as possible from one another.

As an alternative, in accordance with claim 8 it is also possible to take into account the intensity profiles of the reconstructed image itself for the evaluation of the incorrect adaptation of the spatial sensitivity profiles. This offers the advantage that information as regards the displacements of the receiving elements can be derived notably from the directions of the intensity gradients occurring. This knowledge can be advantageously used to carry out the automatic adaptation of the spatial sensitivity profiles more systematically and hence faster.

An MR apparatus as disclosed in claim 9 is suitable for carrying out the MR imaging method in accordance with the invention. The implementation in a conventional MR tomography apparatus in clinical use is simply possible, without any adaptation of the hardware being necessary. It is merely necessary to adapt the programming of the reconstruction unit. This can be realized by means of a computer program for controlling an MR apparatus as disclosed in the claims 10 and 11. Such a computer program can be advantageously made available to the users of MR apparatus on a suitable data carrier, such as a disk or a CD-ROM, or by downloading via a data network (Internet).

BRIEF DESCRIPTION OF THE DRAWINGS

Embodiments of the invention will be described in detail hereinafter with reference to the Figures. Therein.

DETAILED DESCRIPTION

Figure 1:
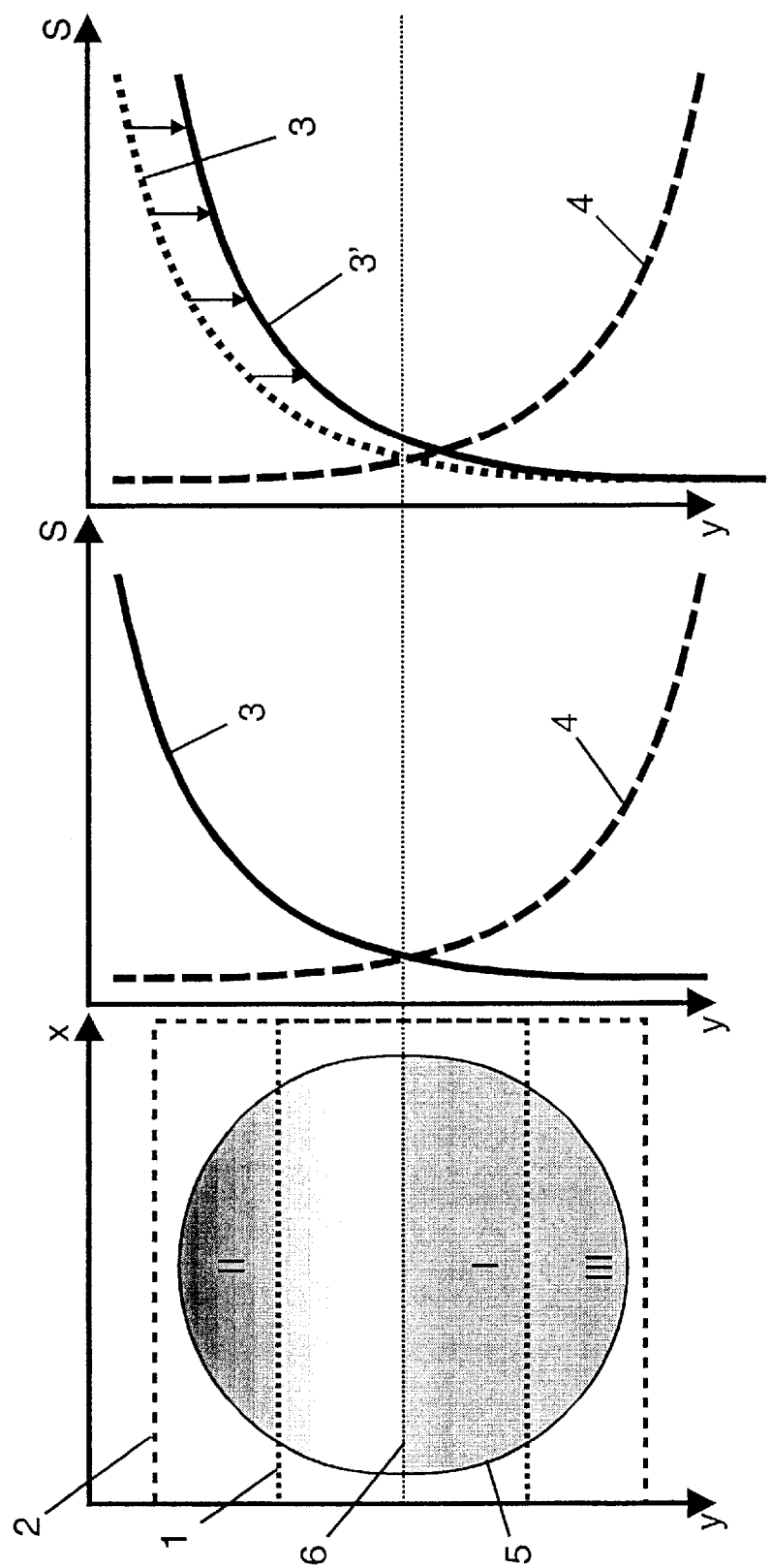
FIG. 1 shows diagrammatically the method in accordance with the invention.

The diagram at the left of the three diagrams shown in FIG. 1 represents the image plane with the co-ordinates x and y. Image acquisition is performed by means of two surface coils which are positioned above and below the image plane, viewed in the Y direction. In the case of image acquisition in conformity with the SENSE method, MR signals are picked up by means of both surface coils while the phase encoding of the pulse sequence used is chosen to be such that a reduced FOV I is scanned. The corresponding image region is denoted by a dotted line 1 in FIG. 1. During the sense reconstruction of the image, image regions II, III that are situated outside the FOV I are reconstructed from the MR data measured by means of the two surface coils. The full image region is delimited by a dashed line 2 in FIG. 1. Sensitivity profiles 3 and 4 of the two surface coils are required for the SENSE reconstruction. The two diagrams at the right show the corresponding dependencies of the sensitivity S on the Y co-ordinate. As can be deduced from the curve 3, the sensitivity of the surface coil that is positioned above the image region decreases as the distance from the coil decreases. The same holds for the sensitivity profile 4 of the lower surface coil. The spatial sensitivity profiles that are shown in the diagram at the center are determined by way of a reference measurement in the method in accordance with the invention. During this reference measurement the complete image region is scanned by means of the two surface coils as described above, after which the sensitivity profiles 3 and 4 are determined by comparison of the images that have been reconstructed in a conventional manner.

The diagram at the left in FIG. 1 depicts the image of a phantom 5 that has been reconstructed in conformity with the SENSE method, be it that the surface coil that is arranged above the image region has been shifted downwards in the Y direction in comparison with the reference measurement. The sensitivity profiles 3 and 4 determined during the reference measurement, therefore, no longer correspond to the position occupied by the receiving coils during the image acquisition. The resultant characteristic image artifacts can be recognized in FIG. 1. In the upper half of the phantom 5 the image intensity increases continuously from the top downwards as far as the center of the image 6. At the center of the image 6 the boundaries of the full image region 2 that have been folded back at the upper and lower edges of the reduced FOV meet. The incorrect adaptation of the sensitivity profile 3 in this case leads to an intensity gradient that can be clearly distinguished. The lower half of the phantom 5 is imaged practically correctly, because the surface coil that is situated underneath the imaging zone has stayed in the position it had during the reference measurement. The intensity gradient at the center of the image 6 can be used in accordance with the invention so as to adapt the spatial sensitivity profiles automatically to the position in space actually occupied by the receiving elements during the image acquisition. To this end, as is shown in the right-hand diagram of FIG. 1, the sensitivity profile 3 that is associated with the upper surface coil is virtually shifted downwards in the Y direction until the image lines that meet one another at the center of the image 6 have the same intensities. The adaptation yields a new sensitivity profile 3' that correctly represents the situation that actually existed during the image acquisition.

Figure 2:
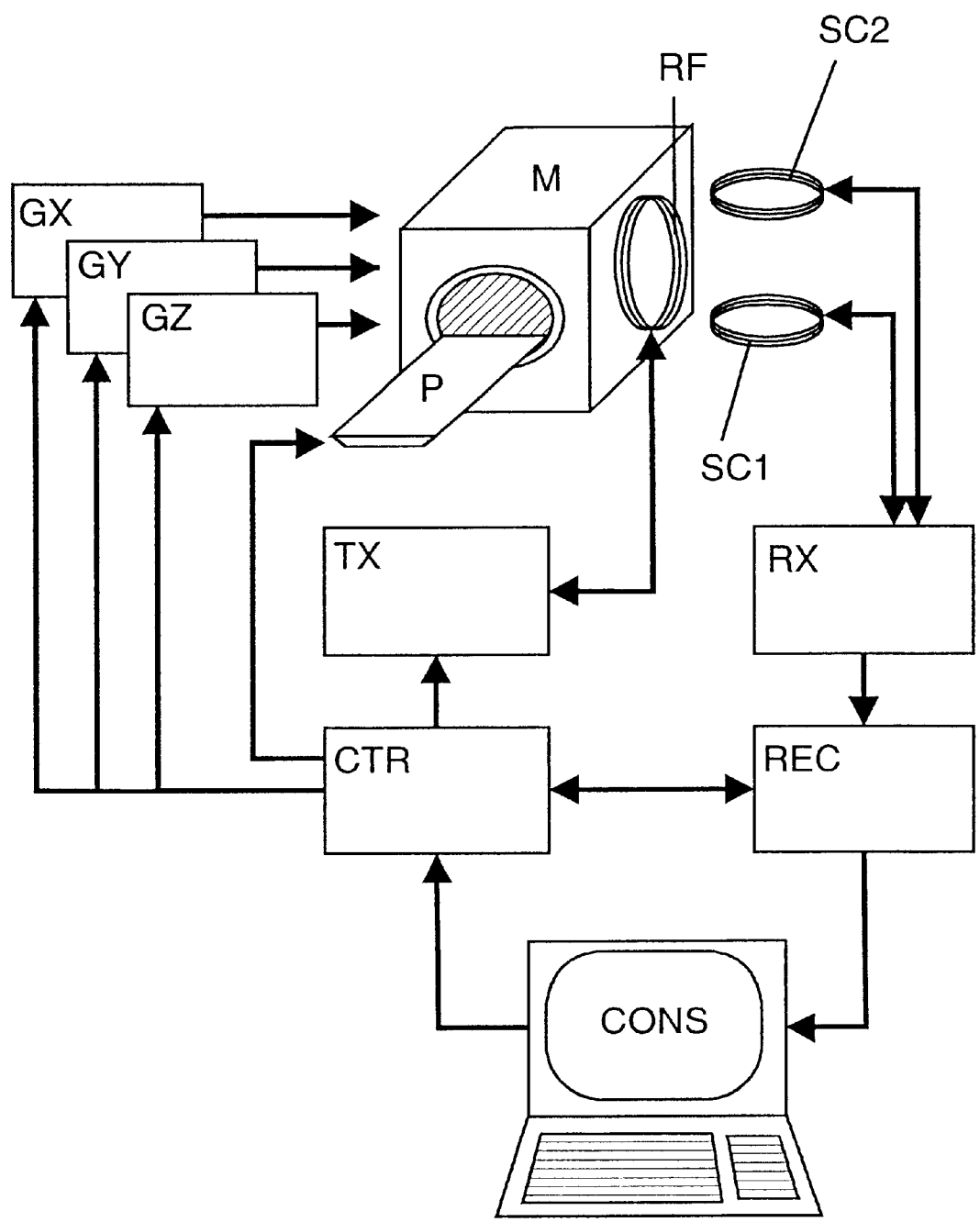
FIG. 2 shows the MR apparatus in accordance with the invention.

FIG. 2 shows diagrammatically an MR apparatus which is suitable for carrying out the method in accordance with the invention. The central element of the apparatus is formed by a main magnet M which generates an essentially homogeneous, steady magnetic field with a flux density of, for example 1.5 Tesla in an examination zone. The magnet M is customarily a superconducting electromagnet. A patient table P on which a patient is accommodated during an examination can be moved into the magnet M. The field direction of the magnet M extends parallel to the longitudinal direction of the patient table P. There is also provided a system of gradient coils GX, GY, GZ which receive a current via gradient amplifiers that are not shown. The gradient pulses that are required for the various pulse sequences can thus be generated in arbitrary spatial directions in the examination zone. An RF coil system RF serves to apply RF pulses to the examination zone. To this end, the coil system RF is connected to an RF power transmitter TX. The transmitter TX is controlled by a control unit CTR which also controls the gradient coils GX, GY, GZ in order to generate the necessary pulse sequences. Moreover, the control unit CTR also changes the position of the patient table P. A reconstruction unit REC digitizes and stores the MR signals that are supplied by the receiver RX and reconstructs images of the examination zone therefrom in conformity with the invention. The receiver RX serves to pick up the MR signals acquired by means of two surface coils SC1 and SC2. The two surface coils SC1 and SC2 have spatial sensitivity profiles that strongly deviate from one another; this constitutes an advantage for the execution of the SENSE method. The reconstruction unit REC stores the sensitivity data of the two surface coils SC1 and SC2. Such data can be acquired, for example, by way of a reference measurement as described above. In order to carry out the method in accordance with the invention, the reconstruction unit REC is programmed in such a manner that the stored sensitivity data can be virtually adapted in conformity with the position in space that was occupied by the receiving elements SC1 and SC2 during the acquisition of the MR data. The reconstruction unit REC also communicates with a control console CONS which is provided with a monitor on which the reconstructed image data is displayed. The console CONS at the same time serves for the control of the entire apparatus and for initiating the desired pulse sequences. To this end, the console CONS also communicates with the control unit CTR. An additional connection exists between the control unit CTR and the reconstruction unit REC. This additional connection is required to supply the reconstruction unit REC with the phase encoding that was used during the image acquisition, because such data is required for the image reconstruction.

What is claimed is:

1. An MR imaging method comprising:
   using a reference measurement to determine spatial sensitivity profiles for at least two individual receiving elements, wherein during the reference measurement, a complete image region is scanned by the at least two receiving elements;

acquiring a number of MR data sets with the at least two receiving elements; and combining the MR data sets so as to form an image of a nuclear magnetization distribution in an examination zone, wherein combining the MR data sets includes utilizing the fact that a spatial sensitivity profile of a receiving element used for the acquisition of a relevant MR data set is associated with each MR data set, said method further comprising:

adapting the spatial sensitivity profiles during image reconstruction in conformity with a respective position in space of the at least two receiving elements during the acquisition of the MR data sets to compensate for displacements in space and/or rotations of the at least two receiving elements as they occur during actual image acquisition by subjecting the spatial sensitivity profiles to a corresponding geometric transformation.

2. The method of claim 1, wherein adapting includes varying the spatial sensitivity profiles to simulate displacements and/or rotations of the relevant receiving elements relative to respective reference positions.

3. The method of claim 1, wherein adapting includes a deformation correction of the spatial sensitivity profiles, wherein deformation of the receiving elements results in changes to the spatial sensitivity profiles.

4. The method of claim 1, wherein the adaptation is performed automatically by repeating the image reconstruction on the basis of the same RF data sets and while systematically varying the spatial sensitivity profiles until image artifacts that are due to displacements and/or rotations of the receiving elements have been minimized.

5. The method of claim 4, further wherein during the minimizing of the image artifacts the image reconstruction is limited to parts of the overall image region.

6. The method of claim 5, further wherein gradients in the image intensity are evaluated as a criterion for minimizing the image artifacts.

7. The method of claim 6, further wherein neighboring image lines are compared with one another in order to evaluate gradients in the image intensity.

8. The method of claim 4, wherein gradients in the image intensity are evaluated as a criterion for minimizing the image artifacts.

9. An MR apparatus for carrying out the method claimed in claim 1, said apparatus comprising:

a gradient coil system having gradient coils for generating magnetic field gradients;

an RF coil system having RF coils for generating RF pulses;

at least two receiving coils that have different spatial sensitivity profiles and serve to receive MR signals from an examination zone;

a control unit that controls the gradient coils and RF coils so as to apply imaging pulse sequences to an examination zone; and a reconstruction unit which stores and processes MR data and spatial sensitivity data to form an image of the nuclear magnetization distribution in the examination zone, wherein the reconstruction unit is programmed in such a manner that during the image reconstruction, the reconstruction unit adapts spatial sensitivity data of respective spatial sensitivity profiles in conformity with a position in space of the respective receiving coils during the acquisition of the MR data.

10. A computer program for controlling an MR apparatus as claimed in claim 9, wherein the program combines the MR data while utilizing the spatial sensitivity profiles, the sensitivity data being adapted to the position in space of the receiving coils during the image acquisition.

11. The computer program as claimed in claim 10, wherein the program repeats the image reconstruction on the basis of the same MR data and while varying the spatial sensitivity profiles until image artifacts that are due to displacements and/or rotations of the receiving coils have been minimized.

* * * * *